United States Patent
Kim

(10) Patent No.: US 9,679,944 B2
(45) Date of Patent: Jun. 13, 2017

(54) ELECTRONIC DEVICE AND METHOD FOR FABRICATING THE SAME

(71) Applicant: SK hynix Inc., Icheon-Si (KR)

(72) Inventor: Jung-Nam Kim, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 133 days.

(21) Appl. No.: 14/684,039

(22) Filed: Apr. 10, 2015

(65) Prior Publication Data

US 2016/0148979 A1 May 26, 2016

(30) Foreign Application Priority Data

Nov. 21, 2014 (KR) .................. 10-2014-0163323

(51) Int. Cl.
| | |
|---|---|
| *G11C 11/21* | (2006.01) |
| *H01L 27/24* | (2006.01) |
| *H01L 43/02* | (2006.01) |
| *H01L 43/08* | (2006.01) |
| *H01L 45/00* | (2006.01) |
| *H01L 27/22* | (2006.01) |
| *G06F 13/16* | (2006.01) |

(52) U.S. Cl.
CPC ...... *H01L 27/2463* (2013.01); *G06F 13/1673* (2013.01); *H01L 27/228* (2013.01); *H01L 27/2436* (2013.01); *H01L 43/02* (2013.01); *H01L 43/08* (2013.01); *H01L 45/06* (2013.01); *H01L 45/08* (2013.01); *H01L 45/1233* (2013.01); *G11C 11/21* (2013.01); *Y02B 60/1228* (2013.01)

(58) Field of Classification Search
CPC . H01L 27/2463; H01L 45/1233; H01L 43/08; H01L 45/06; H01L 27/2436; H01L 45/08; H01L 27/228; H01L 43/02; G06F 13/1673
See application file for complete search history.

(56) References Cited

U.S. PATENT DOCUMENTS

| | | | |
|---|---|---|---|
| 5,846,881 A | 12/1998 | Sandhu et al. | |
| 5,940,698 A * | 8/1999 | Gardner | ............ H01L 21/28079 257/E21.202 |
| 7,485,536 B2 * | 2/2009 | Jin | ...................... H01L 29/7851 257/E21.043 |

(Continued)

FOREIGN PATENT DOCUMENTS

KR  10-2014-0083747 A  7/2014

*Primary Examiner* — Khamdan Alrobaie
(74) *Attorney, Agent, or Firm* — Perkins Coie LLP

(57) ABSTRACT

An electronic device is provided. An electronic device according to an example of the disclosed technology includes a semiconductor memory, the semiconductor memory including: a substrate including a recess formed in the substrate; a gate including at least a portion that is buried in the substrate; a junction formed at both sides of the gate in the substrate; and a memory element electrically connected to the junction at one side of the gate, wherein the junction includes: a barrier layer formed over the recess such that a thickness of the barrier layer formed over a bottom surface of the recess is different from that of the barrier layer formed over a side surface of the recess; a contact pad formed over the barrier layer so as to fill the recess; and an impurity region formed in the substrate and located under the contact pad.

19 Claims, 10 Drawing Sheets

(56) References Cited

U.S. PATENT DOCUMENTS

| | | | |
|---|---|---|---|
| 2011/0024815 A1* | 2/2011 | Kim | H01L 21/823437 257/302 |
| 2011/0037111 A1* | 2/2011 | Kim | H01L 27/10885 257/302 |
| 2011/0156119 A1* | 6/2011 | Chung | H01L 21/823456 257/306 |
| 2012/0025087 A1* | 2/2012 | Daghighian | H01L 31/119 250/370.01 |
| 2012/0211831 A1* | 8/2012 | Hsieh | H01L 21/823481 257/334 |
| 2015/0349073 A1* | 12/2015 | Kang | H01L 29/4236 257/330 |

* cited by examiner

ELECTRONIC DEVICE AND METHOD FOR FABRICATING THE SAME

CROSS-REFERENCE TO RELATED APPLICATIONS

This patent document claims priority of Korean Patent Application No. 10-2014-0163323, entitled "ELECTRONIC DEVICE AND METHOD FOR FABRICATING THE SAME" and filed on Nov. 21, 2014, which is incorporated herein by reference in its entirety.

BACKGROUND

This patent document relates to memory circuits or devices and their applications in electronic devices or systems.

Recently, as electronic devices or appliances trend toward miniaturization, low power consumption, high performance, multi-functionality, and so on, there is a demand for electronic devices capable of storing information in various electronic appliances such as a computer, a portable communication device, and so on and research and development for such electronic devices have been conducted. Examples of such electronic devices can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which has improved reliability.

In one aspect, an electronic device is provided to include a semiconductor memory that includes: a substrate including a recess formed in the substrate; a gate including at least a portion that is buried in the substrate; a junction formed at both sides of the gate in the substrate; and a memory element electrically connected to the junction at one side of the gate, wherein the junction includes: a barrier layer formed over the recess such that a thickness of the barrier layer formed over a bottom surface of the recess is different from that of the barrier layer formed over a side surface of the recess; a contact pad formed over the barrier layer so as to fill the recess; and an impurity region formed in the substrate and located under the contact pad.

In some implementations, the thickness of the barrier layer over the bottom surface of the recess may be greater than that of the barrier layer over the side surface of the recess. In some implementations, the barrier layer over the bottom surface of the recess may be highly crystalline and dense compared to the barrier layer on the side surface of the recess. In some implementations, the barrier layer may include a multilayer structure including a lower barrier layer and an upper barrier layer, and the lower barrier layer may be formed at a lower temperature than the upper barrier layer. In some implementations, the barrier layer may include a multilayer structure including a lower barrier layer and an upper barrier layer, and the lower barrier layer may be highly crystalline and dense compared to the upper barrier layer. In some implementations, the substrate may include silicon, the contact pad may include a metallic material, and the barrier layer may include a metal silicide. In some implementations, the content of silicon in the barrier layer over the bottom surface of the recess may be higher than that in the barrier layer over the side surface of the recess. In some implementations, the barrier layer over the bottom surface of the recess may include a metal silicide, and the barrier layer over the side surface of the recess may include a multilayer structure including a stack of a metal layer, a metal silicide and a silicon layer. In some implementations, the gate may include: a gate insulating layer formed over a trench in the substrate; a gate electrode formed over the gate insulating layer so as to gap-fill a portion of the trench; and a gate sealing layer formed over the gate electrode so as to gap-fill the remaining portion of the trench. In some implementations, the memory element may include a variable resistance element that is switched between different resistance states according to an applied voltage or current. In some implementations, the variable resistance element may include a magnetic tunnel junction having a tunnel barrier interposed between two magnetic materials. In some implementations, the variable resistance element may include a metal oxide, a phase change material or a ferroelectric material.

In some implementations, the electronic device may further comprising a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further comprising a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further comprising a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further comprising a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further comprising a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device is provided to include a semiconductor memory that includes: a substrate; a buried gate over the substrate and including a gate electrode; and junction regions formed at both sides of the buried gate to include a contact pad, an impurity region, and a barrier layer interposed between the contact pad and the impurity region, wherein the bottom of the barrier layer is located above the top of the gate electrode.

In some implementations, the thickness of the barrier layer may vary with a location of the barrier layer. In some implementations, the material content of the barrier layer may vary depending with the location of the barrier layer.

In another aspect, a method for fabricating an electronic device is provided. The method may include: forming a gate having a portion that is buried in a substrate; forming a recess at both sides of the gate in the substrate; forming an impurity region under the recess in the substrate; forming a barrier layer over the recess such that a thickness of the barrier layer over a bottom surface of the recess is different from that of the barrier layer on a side surface of the recess; and forming a contact pad over the barrier layer so as to gap-fill the recess.

In some implementations, the forming of the barrier layer may include: forming a metal layer over the surface of the recess; forming a silicon layer over the metal layer; and performing an annealing process. In some implementations, the forming of the impurity region may include: forming an ion-implanted region under the recess in the substrate; and activating the ion-implanted region during the annealing process. In some implementations, the method may further include: after forming the metal layer, performing a treatment for removing an impurity component from the metal layer. In some implementations, the forming of the barrier layer may include reacting the metal layer, the substrate and the silicon layer during the annealing process. In some implementations, each of the metal layer and the silicon layer may be formed to have such a thickness that the metal layer and silicon layer formed over the bottom surface of the recess is completely consumed during the annealing process. In some implementations, the annealing process may be performed until the metal layer and silicon layer formed over the bottom surface of the recess is completely consumed. In some implementations, the forming of the gate may include: selectively etching the substrate to form a trench; forming a gate insulating layer over the surface of the trench; forming a gate electrode over the gate insulating layer so as to gap-fill a portion of the trench; and forming a gate sealing layer over the gate electrode so as to gap-fill the remaining portion of the trench.

Those and other aspects of the disclosed technology and their implementations and variations are described in greater detail in the drawings, the description and the claims.

DETAILED DESCRIPTION

Figure 1:
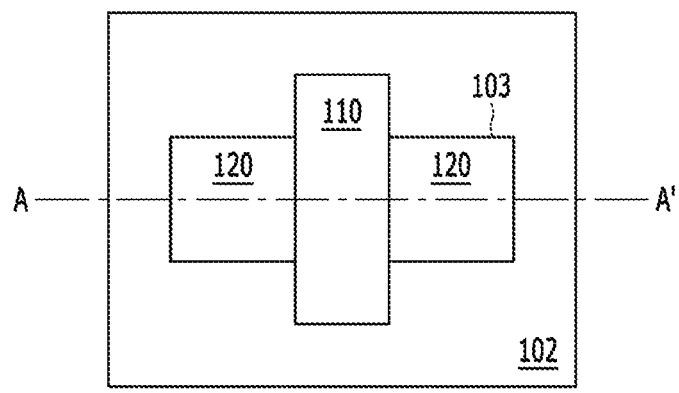
FIG. 1 is a top view showing a transistor according to an example of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the disclosed technology provide an electronic device having improved reliability and a method for fabricating the same. More specifically, the implementations relate to a transistor and a method for fabricating the same, which has reduced junction (i.e., source/drain) resistance (or contact resistance). For example, the junction of a transistor generally includes an impurity region formed by implanting impurity ions into a substrate, and there is a limit to reduce the contact resistance of the junction, due to the solid solubility between the substrate and the impurity. An improved junction was proposed, which has a stack structure composed of or including a conductive layer formed on the impurity region in order to reduce the contact resistance. However, the improved junction causes other problems, such as the increase in resistance of the conductive layer caused by the outward diffusion of impurities in the impurity region, and the increase in contact resistance between the impurity region and the conductive layer due to the potential barrier therebetween.

Thus, the following implementations of the disclosed technology provide a transistor having a junction capable of overcoming the above-described problems, a semiconductor memory including the transistor, an electronic device including the semiconductor memory, and a method for fabricating the electronic device.

Figure 2:
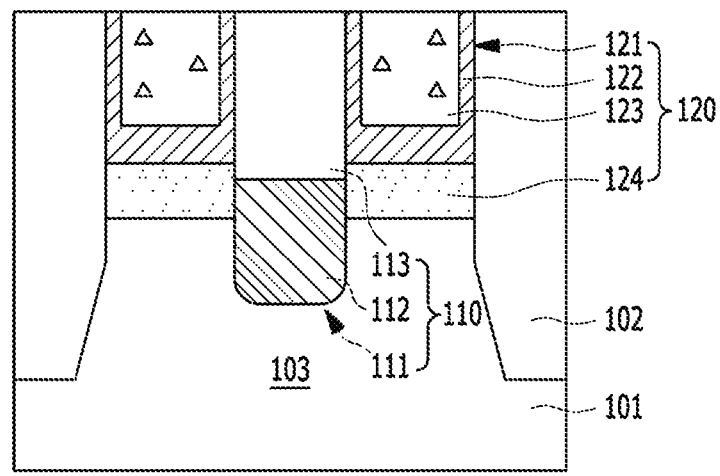
FIG. 2 is a cross-sectional view showing a transistor according to an example of the disclosed technology.
Figure 3:
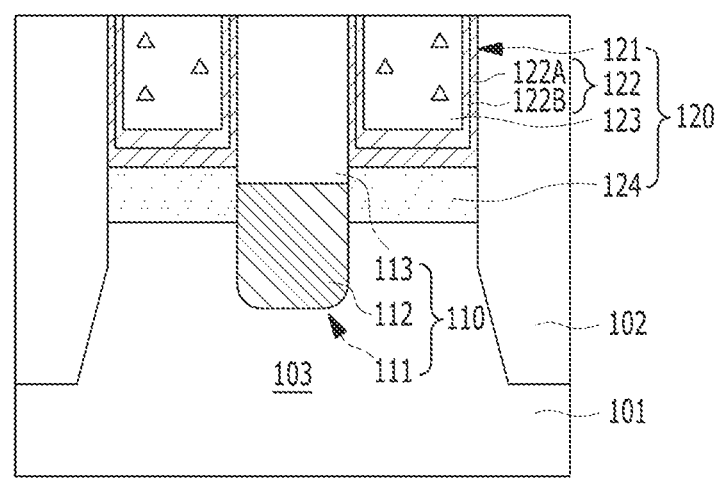
FIG. 3 is a cross-sectional view showing a transistor according to an example of the disclosed technology.

FIG. 1 is a top view showing a transistor according to an implementation of the disclosed technology, and FIGS. 2 and 3 are cross-sectional views taken along line A-A' in FIG. 1 and showing transistors according to an example of the disclosed technology and a modified example thereof, respectively.

As shown in FIGS. 1 to 3, a transistor according to an example of the disclosed technology or an modified example thereof may include a buried gate 110, at least a portion of which is buried in a substrate 101, and a junction (for example, a source and a drain) formed at both sides of the buried gate 110 in the substrate 101. Herein, the junction 120 may include a barrier layer 122 formed in a recess 121 in the substrate 101, a contact pad 123 formed on or over the barrier layer 122 so as to gap-fill the recess 121, and an impurity region 124 formed under the contact pad 123 in the substrate 101.

Hereinafter, each of the components of a transistor according to an example of the disclosed technology will be described in further detail.

A transistor according to an example of the disclosed technology may include an element isolation layer 102 formed in a substrate 101 to define an active region 103. The substrate 101 may be or include a single-crystalline semiconductor substrate, and may include a silicon-containing material. In other words, the semiconductor substrate may include a single-crystalline silicon-containing material. For example, the substrate 101 may be or include either a single-crystalline bulk silicon substrate or a silicon-on-insulator (SOI) substrate composed of or including a support substrate, a buried insulating layer and a single-crystalline silicon layer. In one implementation, the support substrate, a buried insulating layer and a single-crystalline silicon layer are sequentially deposited in the order.

The element isolation layer 102 defining the active region 103 may be formed by a shallow trench isolation (STI) process. Thus, the element isolation layer 102 may include element isolation trenches formed in the substrate 101, and an insulating material gap-filled in the element isolation trenches. The element isolation layer 102 may include any one or more selected from the group consisting of or including an oxide layer, a nitride layer and an oxynitride layer. The active region 103 defined by the element isolation layer 102 may be of or include a bar type or a line type, which has a long axis and a short axis.

In addition, the transistor according to the example of the disclosed technology may include a buried gate 110 having at least a portion buried in the substrate 101. Herein, the buried gate 110 refers to a gate structure in which a portion or the whole of the buried gate 110 is buried in the substrate 101. For example, the buried gate 110 may include: a trench 111 formed in the substrate 101; a gate insulating layer (not shown) formed on or over the surface of the trench 111; a gate electrode 112 formed on or over the gate insulating layer to gap-fill a portion of the trench 111; and a gate sealing layer 113 formed on or over the gate electrode 112 to gap-fill the remaining portion of the trench 111.

The trench 111 may be formed so as to cross both the active region 103 and the element isolation layer 102. Herein, the depth of the trench 111 formed in the element isolation layer 102 may be equal to or greater than the depth of the trench 111 formed in the active region 103. If the depth of the trench 111 formed in the element isolation layer 102 is greater than that of the trench 111 formed in the active region 103, the active region 103 under the buried gate 110 may have a pin structure. The gate insulating layer (not shown) may be formed over the surface of the trench 111 (e.g., the entire surface), or may be formed over only a portion of the surface of the trench 111 corresponding to the gate electrode 112. The gate electrode 112 may include a metallic material, for example, tungsten (W). Each of the gate insulating layer and the gate sealing layer 113 may be made of or include any one or a combination of two or more selected from the group consisting of or including an oxide layer, a nitride layer and/or an oxynitride layer.

Also, the transistor according to the example of the disclosed technology may include a junction 120 formed at both sides of the buried gate 110 in the active region 103. The junction 120 may include: a recess 121 formed in the substrate 101; an impurity region 124 formed under the bottom of the recess 121 in the substrate 101; a barrier layer 122 formed over the surface (for example, bottom surface and side surface) of the recess 121; and a contact pad 123 formed on or over the barrier layer 122 so as to gap-fill the recess 121.

The recess 121 serves to provide a space in which the contact pad 123 is to be formed. In order to suppress the occurrence of leakage current between the buried gate 110 and the junction 120, the bottom of the recess 121 may be located above the top of the gate electrode 112. The impurity region 124 may be formed by ion-implanting impurities, for example, N-type impurities, including arsenic (As), phosphorus (P) or the like, or P-type impurities, including boron (B), into the substrate 101. The impurity region 124 may overlap with the gate electrode 112 in a horizontal direction parallel to the top surface of the substrate 101. The contact pad 123 serves to reduce the total resistance of the junction 120, and may include a metallic material. Herein, the term "metallic material" refers to a metal-containing conductive material, and may include a metal, a metal oxide, a metal nitride and/or a metal oxynitride. For example, the contact pad 123 may include titanium nitride (TiN). Although the example illustrates the case in which the contact pad 123 is gap-filled in the recess 121, the contact pad 123 may also be formed such that the contact pad 123 protrudes from the substrate 101 while gap-filling the recess 121. Herein, a portion of the contact pad 123, which protrudes above the substrate, may have a line width greater than that of the recess 121 in order to increase the contact margin.

The barrier layer 122 functions to prevent the outward diffusion of impurities in the impurity region 124 and reduce the potential barrier between the impurity region 124 and the contact pad 123 to thereby reduce the contact resistance therebetween. For this, the barrier layer 122 may include a metal silicide composed of or including a refractory metal bonded to silicon. As the refractory metal, titanium (Ti), cobalt (Co), molybdenum (Mo), platinum (Pt), iridium (Ir), ruthenium (Ru), chromium (Cr), tantalum (Ta) or zirconium (Zr) may be used. Herein, the barrier layer 122, which is interposed between the contact pad 123 and the impurity region 124 and includes a metal silicide, may have varying thicknesses depending on the locations of the impurity region 124. In addition, the content of silicon in the barrier layer 122 may vary depending on the locations of the impurity region 124. For example, the thickness of a portion of the barrier layer 122, which is formed on or over the bottom surface of the recess 121, may be greater than that of a portion of the barrier layer 122, which is formed on or over the side surface of the recess 121. In addition, the content of silicon in a portion of the barrier layer 122, which is formed on or over the bottom surface of the recess 121, may be higher than the content of silicon in a portion of the barrier layer 122, which is formed on or over the side surface of the recess 121. In addition, the barrier layer 122 on or over the bottom surface of the recess 121 may be made of or include a single material layer (i.e., metal silicide layer), whereas the barrier layer 122 on or over the side surface of the recess 121 may be composed of or include a stack of a metal layer, a metal silicide layer and/or a silicon layer. This prevents agglomeration from occurring during a metal silicide formation process and enables the formation of a highly crystalline and dense metal silicide, as described in detail below with respect to a fabrication method (see FIGS. 4A to 4E).

The barrier layer 122 may be or include a single layer (see FIG. 2), or may be or include a multilayer structure composed of or including a stack of two or more different materials (see FIG. 3). If the barrier layer 122 is a single layer, it may be composed of or include a single metal silicide. If the barrier layer 122 is a multilayer structure, it may be composed of or include a stack of two or more different metal silicides. Specifically, referring to FIG. 3, the barrier layer 122 may include a lower barrier layer 122A and an upper barrier layer 122B on or over the lower barrier layer 122A. Herein, the lower barrier layer 122A that comes in contact with the impurity region 124 may have a metal silicide formation temperature lower than that of the upper barrier layer 122B. In addition, the lower barrier layer 122A may be highly crystalline and dense compared to the upper barrier layer 122B. This enables to more effectively prevent the outward diffusion of impurities in the impurity region 124. Thus, the impurities do not from diffusing to the upper barrier layer 122B or the contact pad 123.

Because the junction 120 of the transistor according to the above-described example includes the barrier layer 122, the outward diffusion of impurities from the impurity region 124 to the contact pad 123 can be prevented. Thus, it is possible to prevent deterioration in the characteristics of the transistor and an increase in the contact resistance between the impurity region 124 and the contact pad 123.

In addition, because the barrier layer 122 has varying thicknesses or silicon contents depending on the location of the barrier layer 122, the characteristics of the transistor can be prevented from being deteriorated due to agglomeration of the barrier layer 122 including a metal silicide.

Also, because the junction includes the contact pad 123 and the barrier layer 122, the impurity doping concentration of the impurity region 124 can be reduced, thereby reducing the electric field between the junction 120 and the buried gate 110. Thus, it is possible to improve the characteristics of the transistor.

Figure 4A:
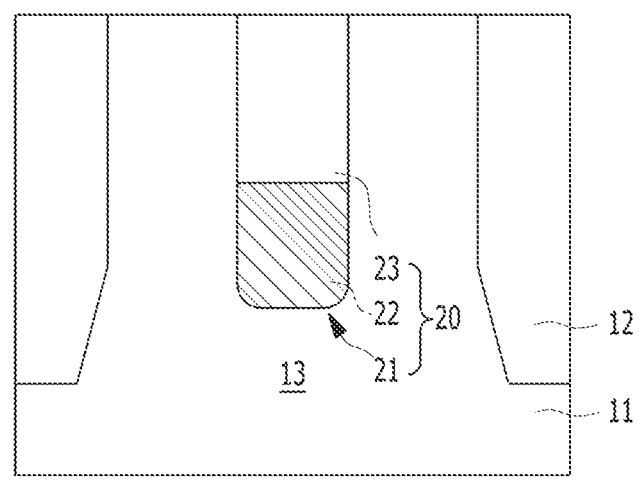
FIGS. 4A to 4E are cross-sectional views showing a method for fabricating a transistor according to an example of the disclosed technology.
Figure 4B:
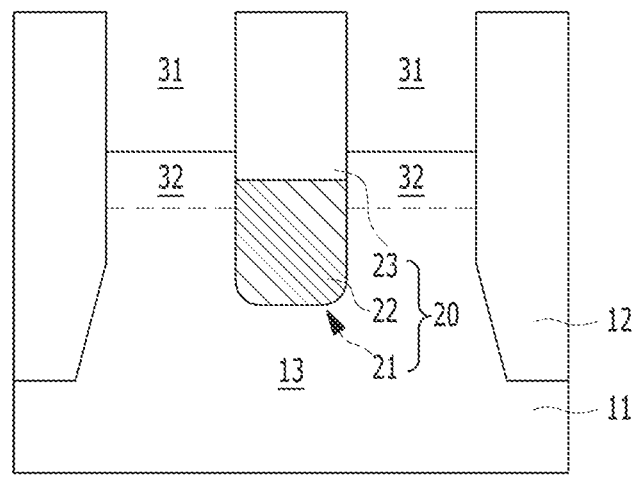

FIGS. 4A to 4B are cross-sectional views taken along line A-A' in FIG. 1, which show a method for fabricating a transistor according to an example of the disclosed technology.

As shown in FIG. 4A, an element isolation layer 12 defining an active region 13 is formed in a substrate 11. The substrate 11 may be or include a single-crystalline semiconductor substrate, and may include a silicon-containing material. The element isolation layer 12 may be formed by a shallow trench isolation (STI) process. Herein, the STI process means or includes a series of processes that include selectively etching the substrate 11 to form an element isolation trench 21 and gap-filling an insulating material in the element isolation trench 21. The active region 13 defined by the element isolation layer 12 may be or include a bar type having a long axis and a short axis, or a line type whose long axis extends in one direction.

Next, a buried gate 20 is formed to have at least a portion buried in the substrate 11. For example, the buried gate 20 may be formed to be entirely buried in the substrate 11. For example, the buried gate 20 may be formed by a series of processes that include selectively etching the substrate 11 to form a trench 21, forming a gate insulating layer (not shown) on the surface of the trench 21, and then forming a gate electrode 22 that gap-fills a portion of the trench 21, and a gate sealing layer 23 that gap-fills the remaining portion of the trench 21 on the gate electrode 22. The trench 21 may be formed by etching both the active region 13 and the element isolation layer 12. Herein, the depth of the trench 21 formed in the element isolation layer 12, may be equal to or greater than that of the trench 21 formed in the active region 13. The gate electrode 22 may be formed by depositing a conductive material over the surface of the substrate 11 (e.g., the entire surface) and then subjecting the deposited conductive material to a blanket etch process, for example, an etch back process. In the process of forming the gate electrode 22, the previously formed gate insulating layer may be partially etched. The gate electrode 22 may include a metallic material, and the metallic material may include tungsten (W). The gate sealing layer 23 may be formed by depositing an insulating material over the surface of the substrate 11, and then performing a polarization process, for example, a chemical mechanical polishing process, until the surface of the substrate 11 is exposed. Each of the gate insulating layer and the gate sealing layer 23 may be formed of or include any one or a combination of two or more selected from the group consisting of or including an oxide layer, a nitride layer and an oxynitride layer.

As shown in FIG. 4B, portions of the active region 13 that are positioned at both sides of the buried gate 20 in the substrate 11 are etched to form recesses 31. In other words, a portion of the substrate 11 is selectively etched to form a recess 31, which will be used to form the junction 30 as discussed later. The recess 31 can be formed by, for example, dry etching such that the bottom of the recess 31 is located above the top of the gate electrode 22. The recess 31 functions to provide a space in which the barrier layer and contact pad of the junction are to be formed later. Further, the recess 31 functions to increase the contact margin (e.g., alignment margin) between the junction and a plug (not shown) to be formed on the junction.

Next, impurity ions are implanted into the bottom of the recess 31 in the substrate 11 to form an ion-implanted region 32. The ion-implanted region 32 can be activated later to form an impurity region. The ion-implanted region 32 can be formed by implanting N-type impurities, including arsenic (As) or phosphorus (P), or P-type impurities, including boron (B). In one implementation, the ion-implanting can proceed in a direction perpendicular to the substrate 11.

Figure 4C:
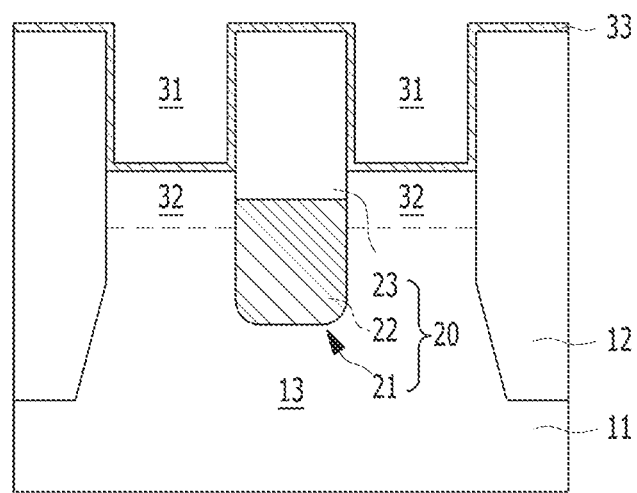

It is general that after the ion-implanted region 32 is formed, an annealing process is performed to activate the injected impurities. However, in this example, the annealing process (activation process) is not performed at this point of time in order to reduce the number of process steps while preventing the outward diffusion of the implanted impurities As shown in FIG. 4C, a metal layer 33 is formed along the surface of the structure including the recess 31. The metal layer 33 may be formed to have such a thickness that a portion of the metal layer 33 formed on the bottom surface of the recess 121 can be completely consumed during a subsequent annealing process. The metal layer 33 may include a refractory metal. Examples of the refractory metal may include titanium (Ti), cobalt (Co), molybdenum (Mo), platinum (Pt), iridium (Ir), ruthenium (Ru), chromium (Cr), tantalum (Ta), or zirconium (Zr), etc. The metal layer 33 may be formed continuously along the surface of the structure including the recess 31 (see FIG. 4C), or may be formed discontinuously along the surface of the structure. The discontinuous metal layer (not shown) means that the metal layer 33 is formed as a plurality of metal dots or metal islands that are spaced by a certain distance from one another.

Next, a treatment is performed for removing impurity components (e.g., an oxygen component, a carbon component or a fluorine component) remaining inside and outside the metal layer 33. This functions to provide a good-quality barrier layer, and may be performed by a plasma treatment process. Herein, the plasma treatment process may be performed in an atmosphere of a mixture of hydrogen gas and nitrogen gas.

Figure 4D:
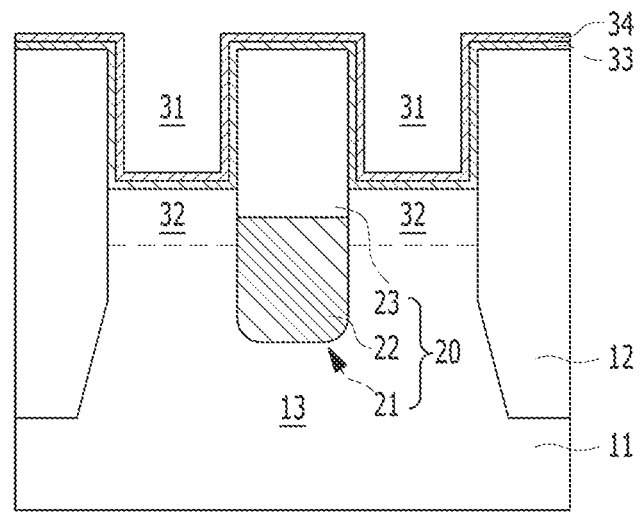

As shown in FIG. 4D, a semiconductor layer is formed on the metal layer 33. The semiconductor layer may include a layer made of the same material as that of the substrate 11. Thus, the semiconductor layer may be or include a silicon layer 34. The silicon layer 34 functions to prevent agglomeration during a subsequent process for forming a barrier layer, and concurrently provide a highly crystalline and dense layer quality. The silicon layer 34 can be formed using various known deposition processes. The silicon layer 34 may be formed to have such a thickness that a portion of the silicon layer 34 formed on the bottom surface of the recess can be completely consumed during a subsequent annealing process.

Meanwhile, although not shown in the drawings, if the metal layer 33 is discontinuously formed, the silicon layer 34 can be formed by epitaxial growth. In this case, a metal silicide layer may be formed while the silicon layer 34 is formed. In other words, a barrier layer may be formed while the silicon layer 34 is formed.

Figure 4E:
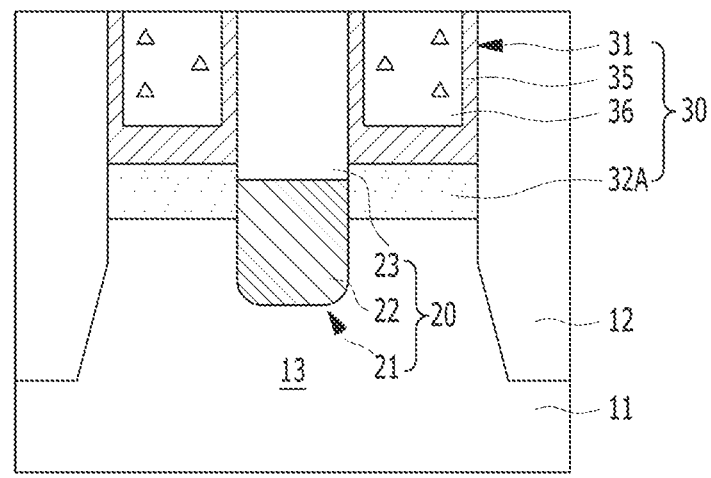

As shown in FIG. 4E, an annealing process is performed so that the ion-implanted region 32 is activated to form an impurity region 32A while the metal layer 33, the substrate 11 and the silicon layer 34 are reacted with one another to form a barrier layer 35 including a metal silicide. Herein, the annealing process may be performed until the metal layer 33 and the silicon layer 34 are completely consumed. The annealing process may be performed by rapid thermal process.

Herein, the barrier layer 35 including a metal silicide can prevent agglomeration from occurring, because it receives silicon from both the substrate under the metal layer 33 and the silicon layer 34 on or over the metal layer 33. The barrier layer 35 on or over the side surface of the recess 31, which does not receive silicon from the substrate 11, may have a thickness smaller than that of the barrier layer 35 on or over the bottom surface of the recess 31. In addition, the barrier layer 35 on or over the side surface of the recess 31 may have a silicon content per unit volume which is lower than that of the barrier layer 35 on or over the bottom surface of the recess 31. Also, the barrier layer 35 on or over the bottom surface of the recess 31 may be entirely composed of or include a metal silicide, whereas the barrier layer 35 on or over the side surface of the recess 31 may be composed of or include a stack of the metal layer 33, a metal silicide and the silicon layer 34, due to the unreacted remaining portions of the metal layer 33 and the silicon layer 34.

Next, a contact pad 36 that gap-fills the recess 31 is formed on or over the barrier layer 35. The contact pad 36 may include a metallic material. The contact pad 36 can be formed by a series of processes that include forming a conductive material over the surface of the substrate 11 (e.g., the entire surface) to gap-fill the recess 31, and then performing a planarization process (e.g., a chemical mechanical polishing (CMP) process) until the substrate 31 is exposed.

Through the above-described processes, a transistor can be formed which includes the junction 30 including the recess 31, the impurity region 32A, the barrier layer 35 and the contact pad 36.

The transistor according to the above-described example may be used in various electronic devices, for example, a semiconductor memory. For example, a semiconductor memory may include a cell array composed of or including a plurality of arrayed memory cells for storing data. Each of the plurality of memory cells may include a memory element for storing data and a select element for controlling access to the memory element. The transistor according to the example of the disclosed technology may be used as the select element. For example, the transistor according to the example of the disclosed technology may be used in a semiconductor memory for sensing a change in resistance.

The semiconductor memory for sensing a change in resistance may use a variable resistance element as a memory element. As used herein, the term "variable resistance element" refers to an element that can be switched between different resistance states in response to a bias (e.g., current or voltage) applied thereto. The variable resistance element may include a variable resistance material that is used in a resistive memory in which information is stored and erased according to a change in resistivity. The variable resistance materials include various materials that are used in RRAM, PRAM, FRAM, MRAM, or STTRAM, etc. For example, the variable resistance materials include ferromagnetic materials, metal oxides, including transition metal oxides and perovskite-based materials, or phase change materials including chalcogenide-based materials, ferroelectric materials, etc.

Figure 5:
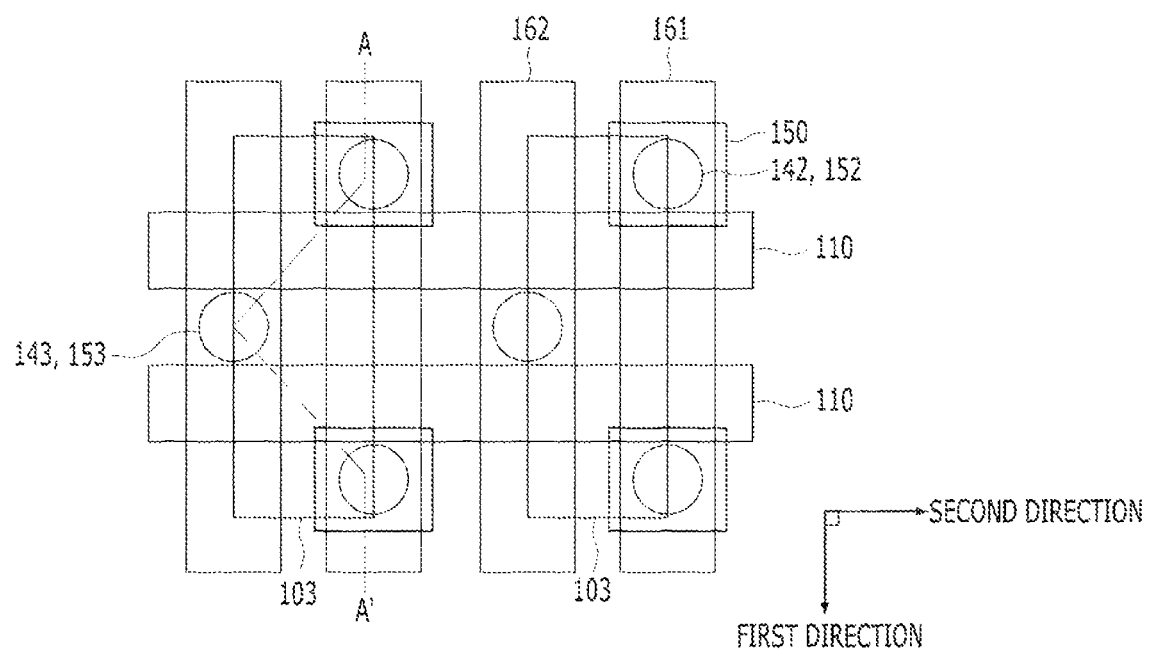
FIG. 5 is a top view showing a semiconductor memory including a transistor according to an example of the disclosed technology.
Figure 6:
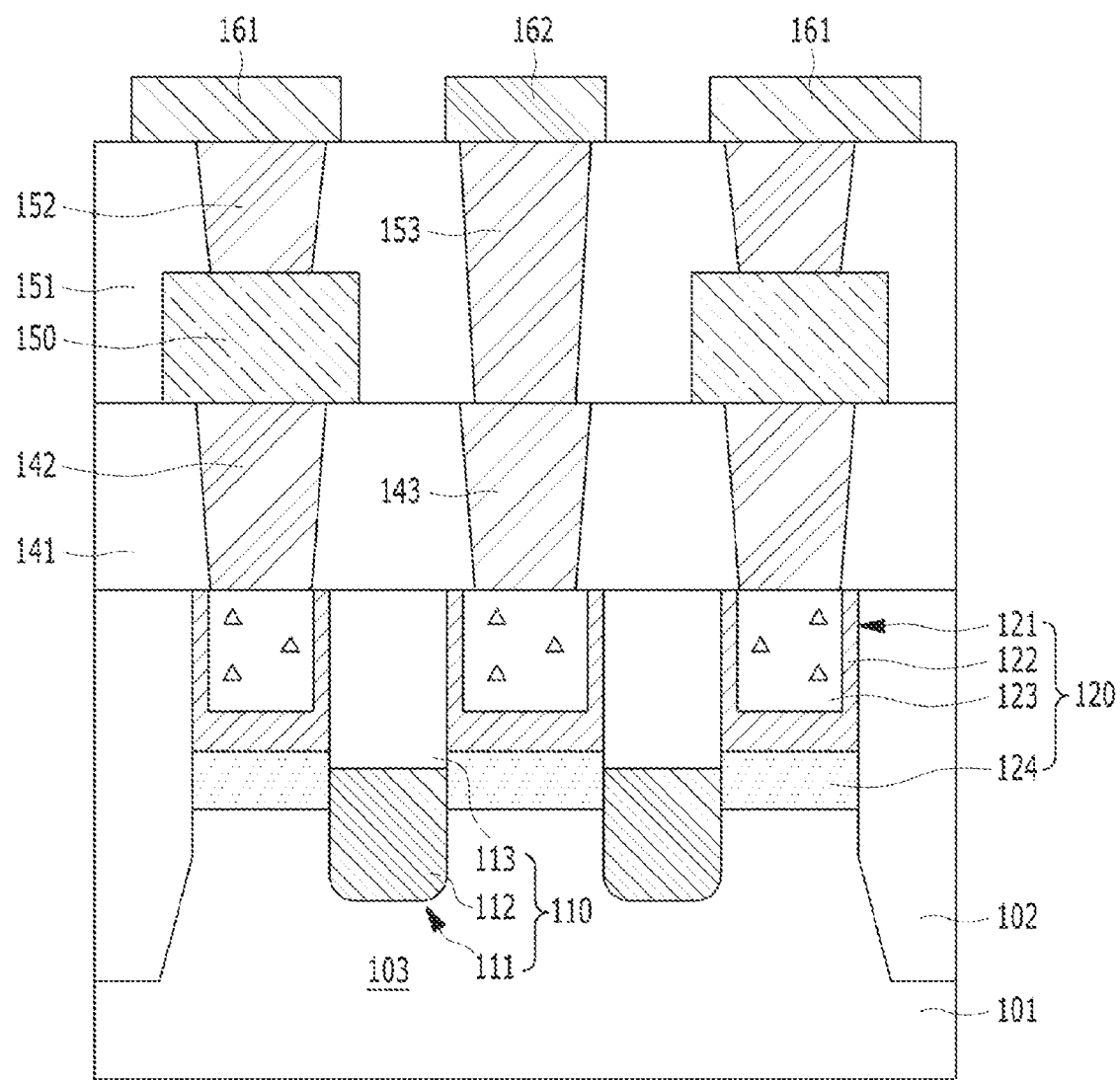
FIG. 6 is a cross-sectional view showing a semiconductor memory including a transistor according to an example of the disclosed technology.

Hereinafter, a semiconductor memory including a transistor according to an example of the disclosed technology will be described in detail with reference to FIGS. 5 and 6. FIG. 5 is a top view showing a semiconductor memory including a transistor according to an example of the disclosed technology. FIG. 6 is a cross-sectional view taken along line A-A' in FIG. 5, which shows a semiconductor memory including a transistor according to an example of the disclosed technology.

As shown in FIGS. 5 and 6, a semiconductor memory according to an example of the disclosed technology may include: an element isolation layer 102 formed in a substrate 101 to define a plurality of active regions 103; and a plurality of transistors, each having a buried gate 110, at least a portion of which is buried in the substrate 101, and a junction 120.

The active regions 103 may be of or include a line type having a short axis and a long axis. The long axis may extend in a first direction, and may be spaced by a certain distance from one another in a second direction perpendicular to the first direction. The plurality of transistors may be or include the transistors according to the above-described example. For example, the buried gate 110 may include: a line-type trench 111 extending in the second direction so as to cross both the active region 103 and the element isolation layer 103; a gate insulating layer (not shown) formed on or over the surface of the trench 111; a gate electrode 112 that gap-fills a portion of the trench 111; and a gate sealing layer 113 that gap-fills the remaining portion of the trench 111. The gate electrode 112 may serve as a word line. A plurality of the transistors may be disposed in each of the active regions 103, and the transistors adjacent to each other may share the junction 120. The junction 120 may include: a barrier layer 122 formed on or over a recess 121 in the substrate 101; a contact pad 123 formed on or over the barrier layer 122 to gap-fill the recess 121; and an impurity region 124 formed under the contact pad 123 in the substrate 101. The transistor including the buried gate 110 and the junction 120 is as described above, and thus the detailed description thereof is omitted herein. In addition, the semiconductor memory according to the example may include: a first interlayer insulating layer 141 formed over the substrate 101; a first plug 142 formed through the first interlayer insulating layer 141 so as to be connected to the junction 120 disposed at both sides of the active region 103; and a second plug 143 formed through the first interlayer insulating layer 141 and connected to the junction 120 between the buried gates 110. The first interlayer insulating layer 141 may be composed of or include any one or a combination of two or more selected from the group consisting of or including an oxide layer, a nitride layer or an oxynitride layer. In the second direction, the first plug 142 may be disposed toward one side of the active region 103, and the second plug 143 may be disposed toward the other side of the active region 103. Herein, due to the contact pad 123 of the junction 120, the contact margin between the first plug 142 and the second plug 143 can be ensured.

In addition, the semiconductor memory according to the example of the disclosed technology may include: a variable resistance element 150 formed on or over the first interlayer insulating layer 141 so as to come in contact with the first plug 142; a second interlayer insulating layer 151 formed on or over the first interlayer insulating layer 141 including the variable resistance element 150; a third plug 152 formed through the second interlayer insulating layer 151 so as to come in contact with the variable resistance element 150; and a fourth plug 153 formed through the second interlayer insulating layer 151 so as to come in contact with the second plug 133. The second interlayer insulating layer 151 may be composed of or include any one or a combination of two or more selected from the group consisting of or including an oxide layer, a nitride layer or an oxynitride layer. Herein, the variable resistance element 150 refers to an element that can be switched between different resistant states in response to a bias (e.g., current or voltage) applied thereto. The variable resistance element 150 may include a magnetic tunnel junction (MTJ) having a tunnel barrier interposed between two magnetic materials, a metal oxide, a phase change material, a ferroelectric material, etc.

In addition, the semiconductor memory according to the example may include a first conductive line 161 and a second conductive line 162 formed on or over the second interlayer insulating layer 151 so as to come in contact with the third plug 152 and the fourth plug 153, respectively. The first conductive line 161 may be a bit line, and the second conductive line 162 may be a source line. Also, the second plug 143 and fourth plug 153 that are connected to the second conductive line 162 may be a source line contact. The first conductive line 161 and the second conductive line 162 may be or have line-type patterns extending in the first direction, and may be alternately disposed to be apart by a certain distance from one another in the second direction.

The semiconductor memory as described above includes a select element such as the transistor including the junction 120 having low resistance, and thus, the operating characteristics and reliability of the semiconductor memory for sensing a change in resistance can be improved.

As described above, the electronic devices according to the examples of the disclosed technology include the barrier layer interposed between the contact pad and the impurity region. Thus, the outward diffusion of impurities in the impurity region can be prevented while the potential barrier between the impurity region and the contact pad can be reduced, thereby reducing the contact resistance therebetween.

The semiconductor memory in accordance with the implementation of the present disclosure may be applied to diverse electronic devices or systems. FIGS. 7 to 11 show some examples of electronic devices or systems that can implement the semiconductor memory disclosed herein.

Figure 7:
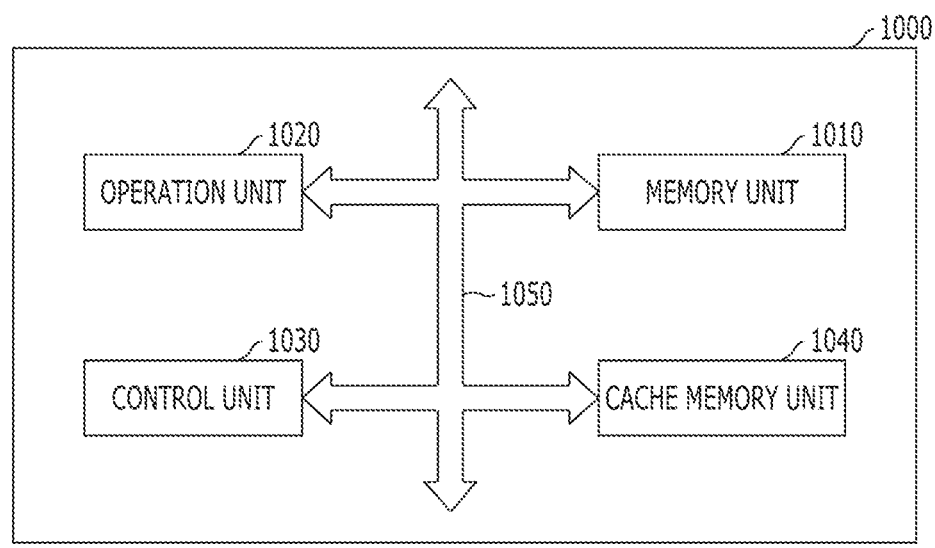
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. the memory unit 1010 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the memory unit 1010 and the microprocessor 1000 may have improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
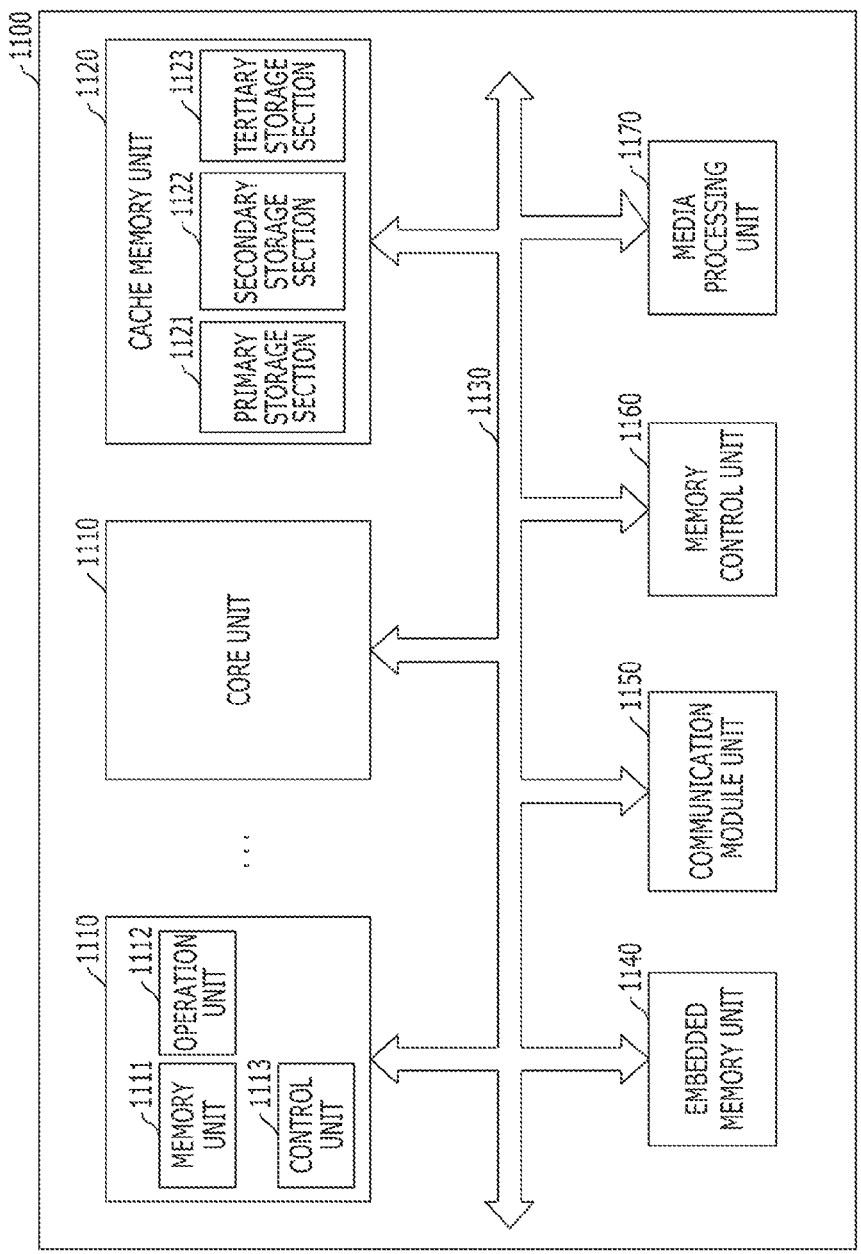
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the cache memory unit 1120 and the processor 1100 may have improved reliability.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
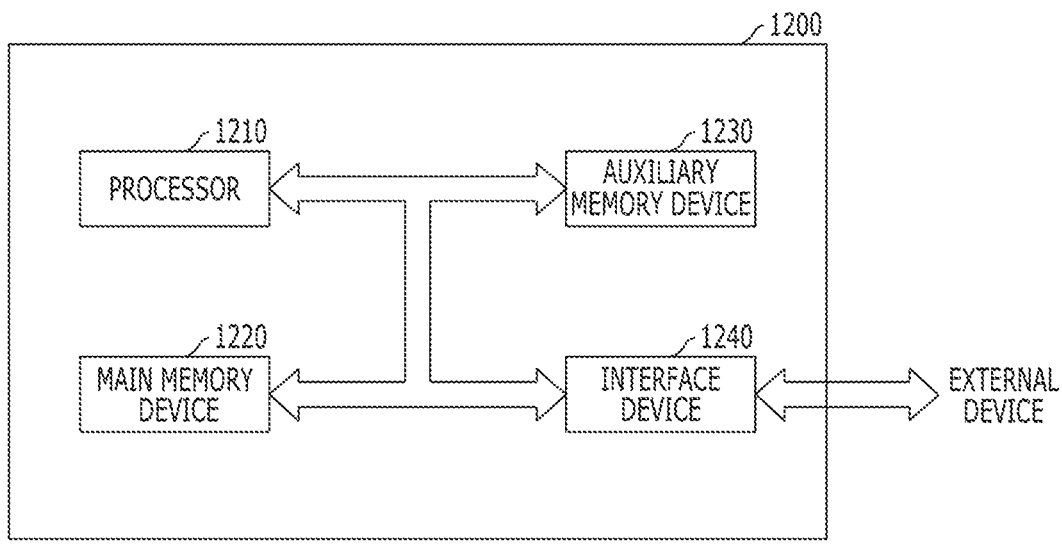
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the main memory device 1220 and the system 1200 may have improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the auxiliary memory device 1230 and the system 1200 may have improved reliability.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
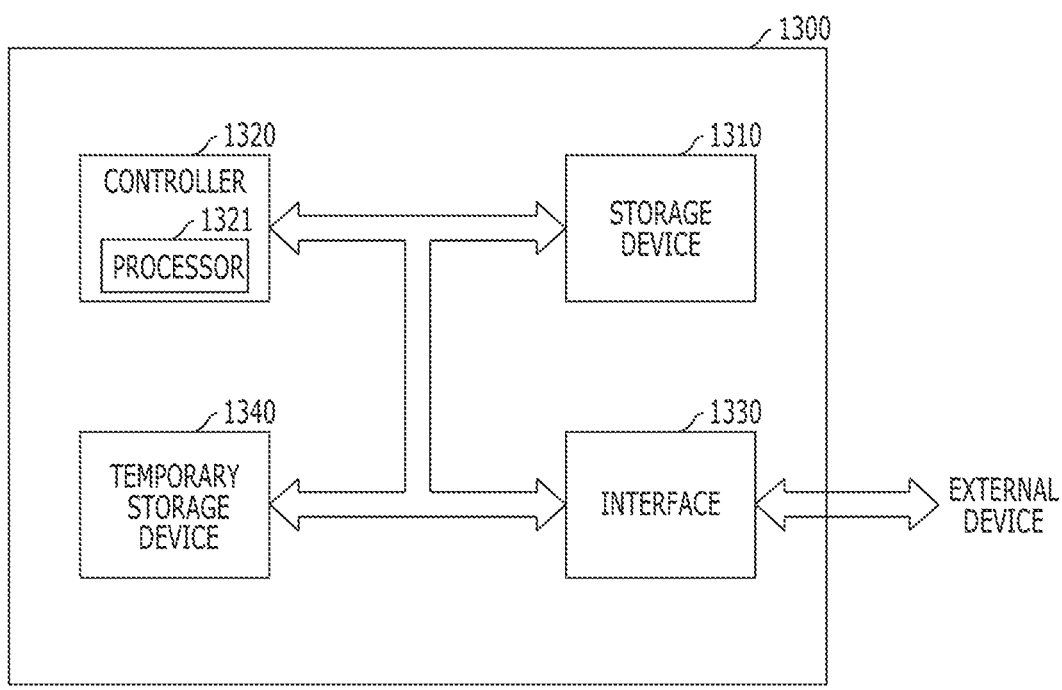
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on. The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the temporary storage device 1340 and the data storage system 1300 may have improved reliability.

Figure 11:
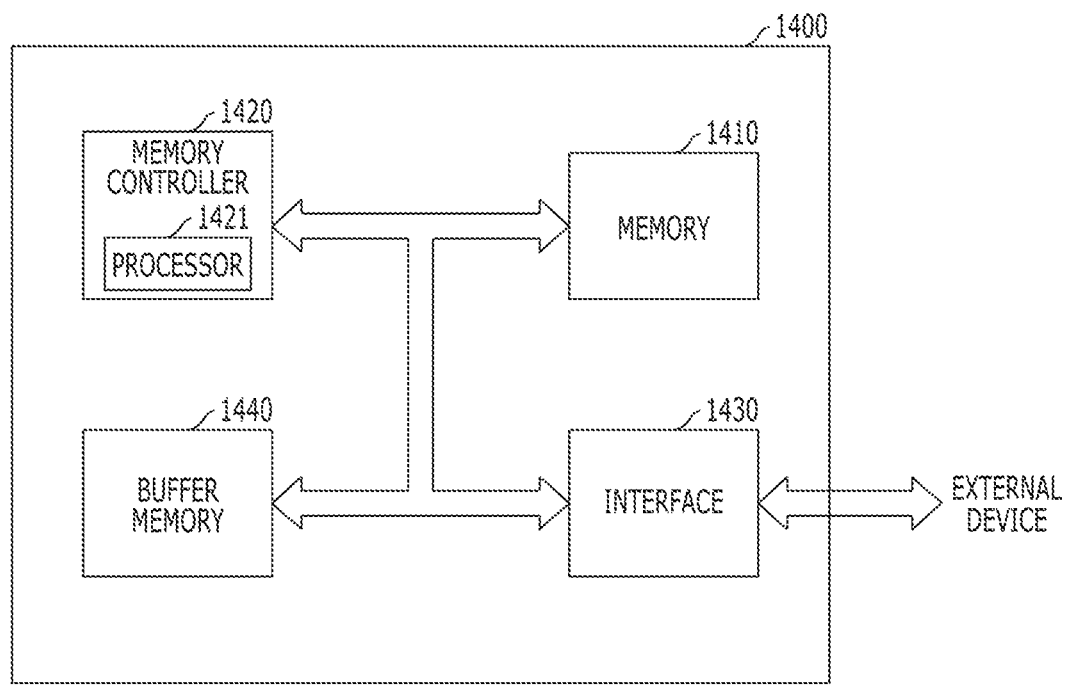
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the memory 1410 and the memory system 1400 may have improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a gate, at least a portion of which is buried in a substrate; a junction formed at both sides of the gate in the substrate; and a memory element connected to the junction formed at one side of the gate, wherein the junction includes: a barrier layer formed on a recess in the substrate such that the thickness of the barrier layer formed on the bottom surface of the recess is different from that of the barrier layer formed on the side surface of the recess; a contact pad formed on the barrier layer so as to gap-fill the recess; and an impurity region formed in the substrate at a position corresponding to the contact pad. Through this, the buffer memory 1440 and the memory system 1400 may have improved reliability.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7 to 11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device including a semiconductor memory, the semiconductor memory comprising:
   a substrate including a recess formed in the substrate;
   a gate including at least a portion that is buried in the substrate;
   a junction formed at both sides of the gate in the substrate; and
   a memory element electrically connected to the junction at one side of the gate,
   wherein the junction comprises:
   a barrier layer formed over the recess such that a thickness of the barrier layer formed over a bottom surface of the recess is different from that of the barrier layer formed over a side surface of the recess;
   a contact pad formed over the barrier layer so as to fill the recess; and
   an impurity region formed in the substrate and located under the contact pad.

2. The electronic device of claim 1, wherein the thickness of the barrier layer over the bottom surface of the recess is greater than that of the barrier layer over the side surface of the recess.

3. The electronic device of claim 1, wherein the barrier layer over the bottom surface of the recess is highly crystalline and dense compared to the barrier layer on the side surface of the recess.

4. The electronic device of claim 1, wherein the barrier layer comprises a multilayer structure including a lower barrier layer and an upper barrier layer, and the lower barrier layer is formed at a lower temperature than the upper barrier layer.

5. The electronic device of claim 1, wherein the barrier layer comprises a multilayer structure including a lower barrier layer and an upper barrier layer, and the lower barrier layer is highly crystalline and dense compared to the upper barrier layer.

6. The electronic device of claim 1, wherein the substrate includes silicon, the contact pad includes a metallic material, and the barrier layer includes a metal silicide.

7. The electronic device of claim 6, wherein a content of silicon in the barrier layer over the bottom surface of the recess is higher than that in the barrier layer over the side surface of the recess.

8. The electronic device of claim 6, wherein the barrier layer over the bottom surface of the recess includes a metal silicide, and the barrier layer over the side surface of the recess comprises a multilayer structure including a stack of a metal layer, a metal silicide and a silicon layer.

9. The electronic device of claim 1, wherein the gate comprises:
   a gate insulating layer formed over a trench in the substrate;
   a gate electrode formed over the gate insulating layer so as to gap-fill a portion of the trench; and
   a gate sealing layer formed over the gate electrode so as to gap-fill the remaining portion of the trench.

10. The electronic device of claim 1, wherein the memory element includes a variable resistance element that is switched between different resistance states according to an applied voltage or current.

11. The electronic device of claim 10, wherein the variable resistance element includes a magnetic tunnel junction having a tunnel barrier interposed between two magnetic materials.

12. The electronic device of claim 10, wherein the variable resistance element includes a metal oxide, a phase change material or a ferroelectric material.

13. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

14. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

15. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

16. The electronic device according to claim 1, further comprising a data storage system which includes:
 a storage device configured to store data and conserve stored data regardless of power supply;
 a controller configured to control input and output of data to and from the storage device according to a command inputted form an outside;
 a temporary storage device configured to temporarily store data exchanged between the storage device and the outside; and
 an interface configured to perform communication between at least one of the storage device, the controller and the temporary storage device and the outside,
 wherein the semiconductor memory is part of the storage device or the temporary storage device in the data storage system.

17. The electronic device according to claim 1, further comprising a memory system which includes:
 a memory configured to store data and conserve stored data regardless of power supply;
 a memory controller configured to control input and output of data to and from the memory according to a command inputted form an outside;
 a buffer memory configured to buffer data exchanged between the memory and the outside; and
 an interface configured to perform communication between at least one of the memory, the memory controller and the buffer memory and the outside,
 wherein the semiconductor memory is part of the memory or the buffer memory in the memory system.

18. An electronic device including a semiconductor memory, the semiconductor memory comprising:
 a substrate;
 a buried gate over the substrate and including a gate electrode; and
 junction regions formed at both sides of the buried gate to include a contact pad, an impurity region, and a barrier layer interposed between the contact pad and the impurity region,
 wherein the bottom of the barrier layer is located above the top of the gate electrode, and
 wherein the thickness of the barrier layer varies with a location of the barrier layer.

19. An electronic device including a semiconductor memory, the semiconductor memory comprising:
 a substrate;
 a buried gate over the substrate and including a gate electrode; and
 junction regions formed at both sides of the buried gate to include a contact pad, an impurity region, and a barrier layer interposed between the contact pad and the impurity region,
 wherein the bottom of the barrier layer is located above the top of the gate electrode, and
 wherein a material content of the barrier layer varies depending with the location of the barrier layer.

* * * * *